(12) United States Patent
Kodama et al.

(10) Patent No.: US 11,153,457 B2
(45) Date of Patent: Oct. 19, 2021

(54) LIGHT RECEIVING UNIT

(71) Applicant: Mitsubishi Electric Corporation, Tokyo (JP)

(72) Inventors: Masatoshi Kodama, Tokyo (JP); Masaki Ono, Tokyo (JP); Mikio Uesugi, Tokyo (JP); Takahiro Ishihara, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 17/044,340

(22) PCT Filed: May 14, 2019

(86) PCT No.: PCT/JP2019/019166
§ 371 (c)(1),
(2) Date: Oct. 1, 2020

(87) PCT Pub. No.: WO2019/225410
PCT Pub. Date: Nov. 28, 2019

(65) Prior Publication Data
US 2021/0105378 A1    Apr. 8, 2021

(30) Foreign Application Priority Data

May 23, 2018  (JP) .............................. JP2018-099171

(51) Int. Cl.
*H04N 1/193* (2006.01)
*H04N 1/028* (2006.01)
*H01L 27/146* (2006.01)

(52) U.S. Cl.
CPC ....... *H04N 1/193* (2013.01); *H01L 27/14605* (2013.01); *H04N 1/028* (2013.01)

(58) Field of Classification Search
CPC ........ A61B 1/043; A61B 1/0638; H04N 5/33; H04N 9/04515; H04N 9/04557;
(Continued)

(56) References Cited

U.S. PATENT DOCUMENTS 9,438,762 B2   9/2016 Abe
10,348,924 B2   7/2019 Fujiuchi et al.
(Continued)

FOREIGN PATENT DOCUMENTS

JP    60-098755 A    6/1985
JP    2011-003956 A   1/2011
(Continued)

OTHER PUBLICATIONS

International Search Report and Written Opinion dated Jun. 25, 2019 for PCT/JP2019/019166 filed on May 14, 2019, 9 pages including English Translation of the International Search Report.
(Continued)

*Primary Examiner* — Negussie Worku
(74) *Attorney, Agent, or Firm* — Xsensus LLP

(57) ABSTRACT

A light receiving unit includes photoelectric conversion elements (20) in which first pixels (201) are arrayed linearly along a long side of a parallelogram-shaped semiconductor substrate (22) and second pixels (202) are arrayed linearly at a location separated away from the first pixels (201) by a predetermined interpolation pixel distance. An output data processor that generates image data based on outputs of the photoelectric conversion elements (20) performs time correction of the image data by coupling image data based on outputs of the second pixels (202) with image data based on outputs of the first pixels (201) that have a time shift equal to a scanning time corresponding to the interpolation pixel distance.

18 Claims, 14 Drawing Sheets

(58) Field of Classification Search
CPC .......... H04N 9/73; H04N 1/028; H04N 1/193;
H01L 27/14605; H01L 27/14609
USPC ........................................................ 358/483
See application file for complete search history.

(56) References Cited

U.S. PATENT DOCUMENTS

| | | | |
|---|---|---|---|
| 2010/0224872 A1* | 9/2010 | Kimura | H01L 29/66969 |
| | | | 257/43 |
| 2012/0261556 A1* | 10/2012 | Abe | H04N 1/1931 |
| | | | 250/208.1 |
| 2018/0249035 A1 | 8/2018 | Fujiuchi et al. | |
| 2020/0077014 A1* | 3/2020 | Kato | G02B 7/34 |
| 2020/0128152 A1* | 4/2020 | Akagi | H04N 1/028 |

FOREIGN PATENT DOCUMENTS

| | | |
|---|---|---|
| JP | 4697494 B | 6/2011 |
| JP | 2011-176567 A | 9/2011 |
| JP | 6214836 B | 10/2017 |
| WO | 2017/104756 A1 | 6/2017 |

OTHER PUBLICATIONS

Notification of Reasons for Refusal received for Japanese Patent Application No. 2019-548760, dated Oct. 29, 2019, 19 pages including English Translation.

Decision to Refusal received for Japanese Patent Application No. 2019-548760, dated Jan. 21, 2020, 14 pages including English Translation.

* cited by examiner

MAIN SCANNING DIRECTION

READING DIRECTION
(SUB-SCANNING DIRECTION)

LIGHT RECEIVING UNIT

CROSS-REFERENCE TO RELATED APPLICATIONS

The present application is based on PCT filing PCT/JP2019/019166, filed May 14, 2019, which claims priority to JP 2018-099171, filed May 23, 2018, the entire contents of each are incorporated herein by reference.

TECHNICAL FIELD

The present disclosure relates to a light receiving unit that are used for an image reading apparatus for reading an image.

BACKGROUND ART

In recent years, there is an increasing need to read a reading target without missing pixels during image reading with a solid-state imaging device. In particular, in the inspection industry, when an abnormality occurs in which a very small foreign object or flaw exists only in a missing pixel portion, there is a problem in that the abnormality is not displayed in a read image.

In order to solve this problem, techniques for eliminating missing pixels and improving image quality are proposed (for example, Patent Literatures 1 and 2). In an image sensor disclosed in Patent Literature 1, light receiving elements are arranged, linearly in a slanted direction, on a surface of a parallelogram-shaped semiconductor substrate from one side of the semiconductor substrate to another side of the semiconductor substrate that is opposite to the one side of the semiconductor substrate, and interpolation elements are provided (i) on one end of one of the one side and the other side of the semiconductor substrate and (ii) outside the light receiving elements. Accordingly, Patent Literature 1 describes an image as being able to be read at a high density without generation of virtual pixels, even when sensor chips are arranged at a constant pitch.

In an image sensor disclosed in Patent Literature 2, rectangular sensor chips are arranged in the longer width direction, and interpolation sensor chips are arranged adjacent to each other in the shorter width direction of adjacent sensor chips. This image sensor has a configuration in which interpolation pixels are arranged in a line along one side in the longer width direction of the sensor chips and on the interpolation sensor chips. Also, another image sensor described in Patent Literature 2 has a configuration in which parallelogram-shaped sensor chips are arranged in the longer width direction, pixels are arranged in a line and along one side in the longer width direction, and interpolation pixels are arranged on one end along a side opposite to the one side.

For any of the image sensors described in Patent Document 2, multiple pixels are disposed that can interpolate missing pixels even when the gap between the ends of adjacent sensor chips becomes the largest in a temperature range in which the image sensors are to be used. Such configuration is described as enabling interpolation of the missing pixels regardless of the temperature range in which the image sensors are used.

CITATION LIST

Patent Literature

Patent Literature 1: Japanese Patent No. 4697494
Patent Literature 2: Japanese Patent No. 6214836

SUMMARY OF INVENTION

Technical Problem

The image sensor disclosed in Patent Literature 1 has a problem in that correction processing is difficult because the pixels are arranged to slant with respect to a scanning direction and thus the influence of a positional difference in a slanting direction is large.

Also, due to effects of shifting of the mounting positions of the respective sensor chips including the interpolation sensor chips, highly accurate correction by the interpolation pixels is difficult for the image sensors disclosed in Patent Literature 2. In addition, since the pixels are arranged in a line and on one side in the longer width direction of the parallelogram-shaped chip and the interpolation pixels are arranged on the other side opposite to the one side, the interpolation pixels are separated from the linearly arranged pixels, and thus, there is a problem in that correction processing is difficult.

In order to solve the aforementioned problem, an objective of the present disclosure is to provide a photoelectric conversion element and a light receiving unit (i) that can read, with high accuracy and without missing pixels to be read, an image as a reading target, and (ii) that enables easy correction processing.

Solution to Problem

In order to achieve the above objective, a photoelectric conversion element of the present disclosure includes (i) a semiconductor substrate having a shape that has a pair of long sides parallel to each other and a pair of short sides, (ii) first pixels disposed on the semiconductor substrate, the first pixels being arrayed linearly in parallel with the long side, and (iii) second pixels disposed on the semiconductor substrate, the second pixels being arrayed linearly in parallel with the long side and separated away from the first pixels by a predetermined interpolation pixel distance in a direction perpendicular to the long side. The second pixels include (i) overlapping pixels disposed on sub-scanning lines that extend in the direction perpendicular to the long side and that pass through first pixels that are the nearest to the short sides among the first pixels, and (ii) interpolation pixels that are near to the short sides than the overlapping pixels.

Advantageous Effects of Invention

According to the present disclosure, pixels are arranged in parallel with the long sides of the parallelogram, and the interpolation pixel is arranged separately at a certain distance. As a result, an image to be read can be read with high accuracy without missing pixels to be read, and correction processing can be easily performed.

DESCRIPTION OF EMBODIMENTS

Embodiments of the present disclosure are described below in detail with reference to the drawings. Components that are the same or equivalent are assigned the same reference signs throughout the drawings.

Embodiment 1

Figure 1:
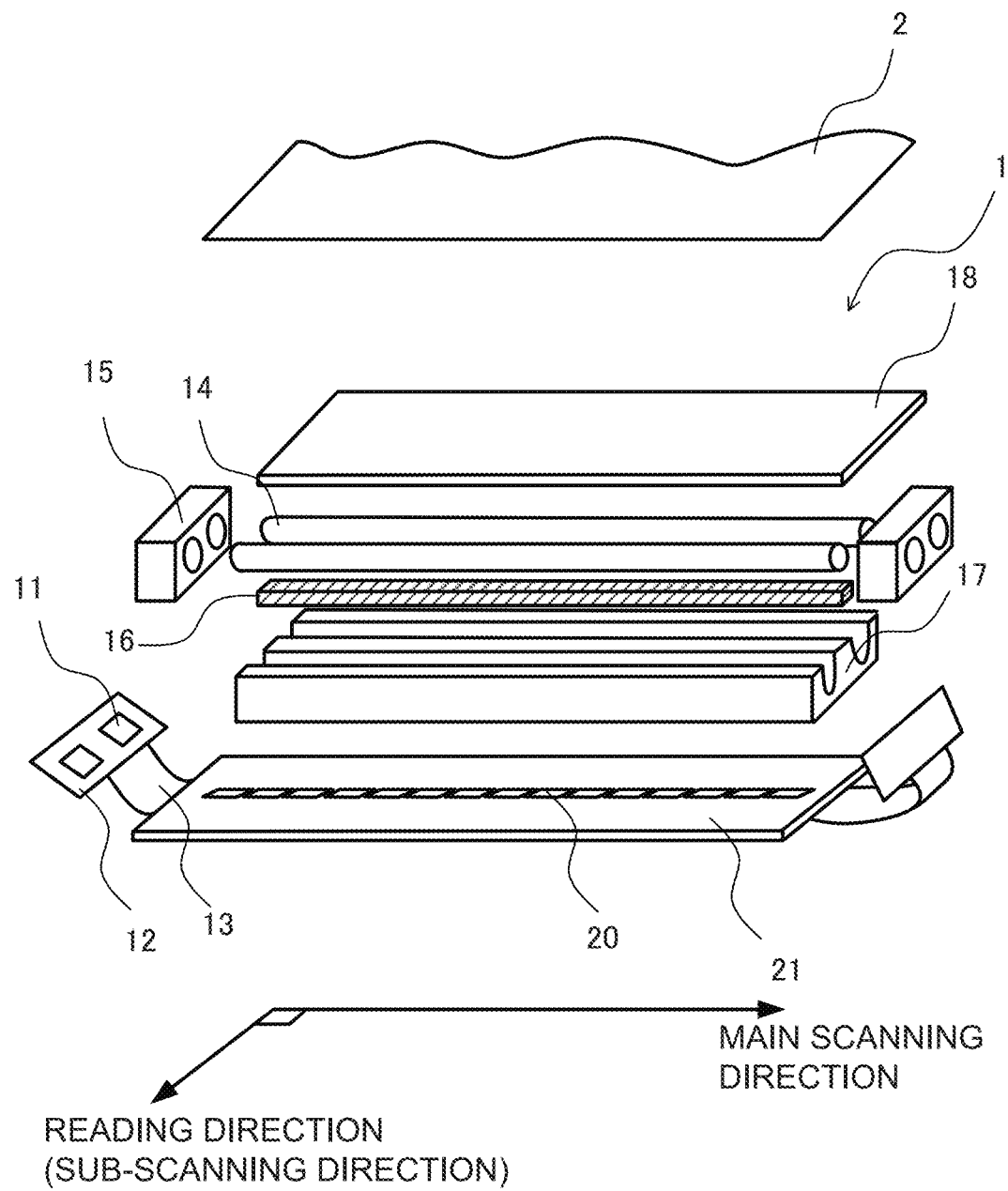
FIG. 1 is an exploded view of an assembly of a light receiving unit according to an embodiment of the present disclosure.

FIG. 1 is an exploded view of an assembly of a light receiving unit according to Embodiment 1. A light receiving unit 1 is an attachably detachable optical unit that is included in an image reading apparatus. By (i) emitting light to an image reading target 2 conveyed relative to the light receiving unit 1 and (ii) outputting a signal obtained by photoelectrically converting, by photoelectric conversion elements 20, reflected light from the image reading target 2, the light receiving unit 1 outputs image data. In this case, the image reading target 2 is, for example, money, a document, or a photograph.

A direction of the conveyance of the image reading target 2 with respect to the light receiving unit 1 is the short width direction of the light receiving unit 1. That is, as illustrated in FIG. 1, a reading direction in which an image is read while relatively conveying the image reading target 2 is the short width direction of the light receiving unit 1. The relative conveyance operation is an operation in which the image reading target 2 is conveyed with the light receiving unit 1 fixed, or an operation in which the light receiving unit 1 is conveyed with the image reading target 2 fixed.

As illustrated in FIG. 1, the light receiving unit 1 includes (i) a light source 11, (ii) a substrate 12 on which the light source 11 is mounted, (iii) a flexible substrate 13 that supplies power to the substrate 12, (iv) a light guide 14 that guides light from the light source 11 to the inside, and (v) a holder 15 that supports both ends of the light guide 14. Also, the light receiving unit 1 includes (vi) a lens body 16 that focuses reflected light from the image reading target 2 to form an image, (vii) a housing 17 that houses or supports the light source 11 and the light guide 14, and (viii) a transmissive body 18 that covers an upper portion of the light receiving unit 1. The image reading target 2 is conveyed relative to and along the transmissive body 18.

Additionally, the light receiving unit 1 includes (ix) the photoelectric conversion elements 20 that are disposed on an optical axis of the lens body 16 that the reflected light from the image reading target 2 enters and receive the light focused by the lens body 16 and photoelectrically convert the received light, and (x) a sensor substrate 21 on which the photoelectric conversion elements 20 are mounted.

The light source 11 is a freely-selected light emitter, for example, an LED chip or a general-purpose mall-type LED. The light guide 14 is formed by molding a freely-selected transparent member, and the transparent member is, for example, a glass material or an acrylic resin. The lens body 16 is a freely-selected optical lens, for example, a rod lens array. The reflected light from the image reading target 2 enters the lens body 16, and the lens body 16 focuses the reflected light on the photoelectric conversion elements 20 to form an image. The transmissive body 18 is formed by molding a freely-selected transparent member, and the transparent member is, for example, a glass material or an acrylic resin.

Each of the photoelectric conversion elements 20 includes (i) a light receiving unit (photoelectric conversion unit) formed on a surface of a semiconductor substrate 22, and (ii) a drive circuit that drives the light receiving unit. The sensor substrate 21 includes an external connector, electronic components, and a signal processing circuit that processes an output signal photoelectrically converted by the photoelectric conversion elements 20. The multiple photoelectric conversion elements 20 are mounted adjacent to each other at image reading positions extending in a main scanning direction of the sensor substrate 21. In this case, as illustrated in FIG. 1, the main scanning direction of the sensor substrate 21 is the longer width direction of the light receiving unit 1 and is perpendicular to the reading direction. In other words, the reading direction is a sub-scanning direction.

Figure 2:
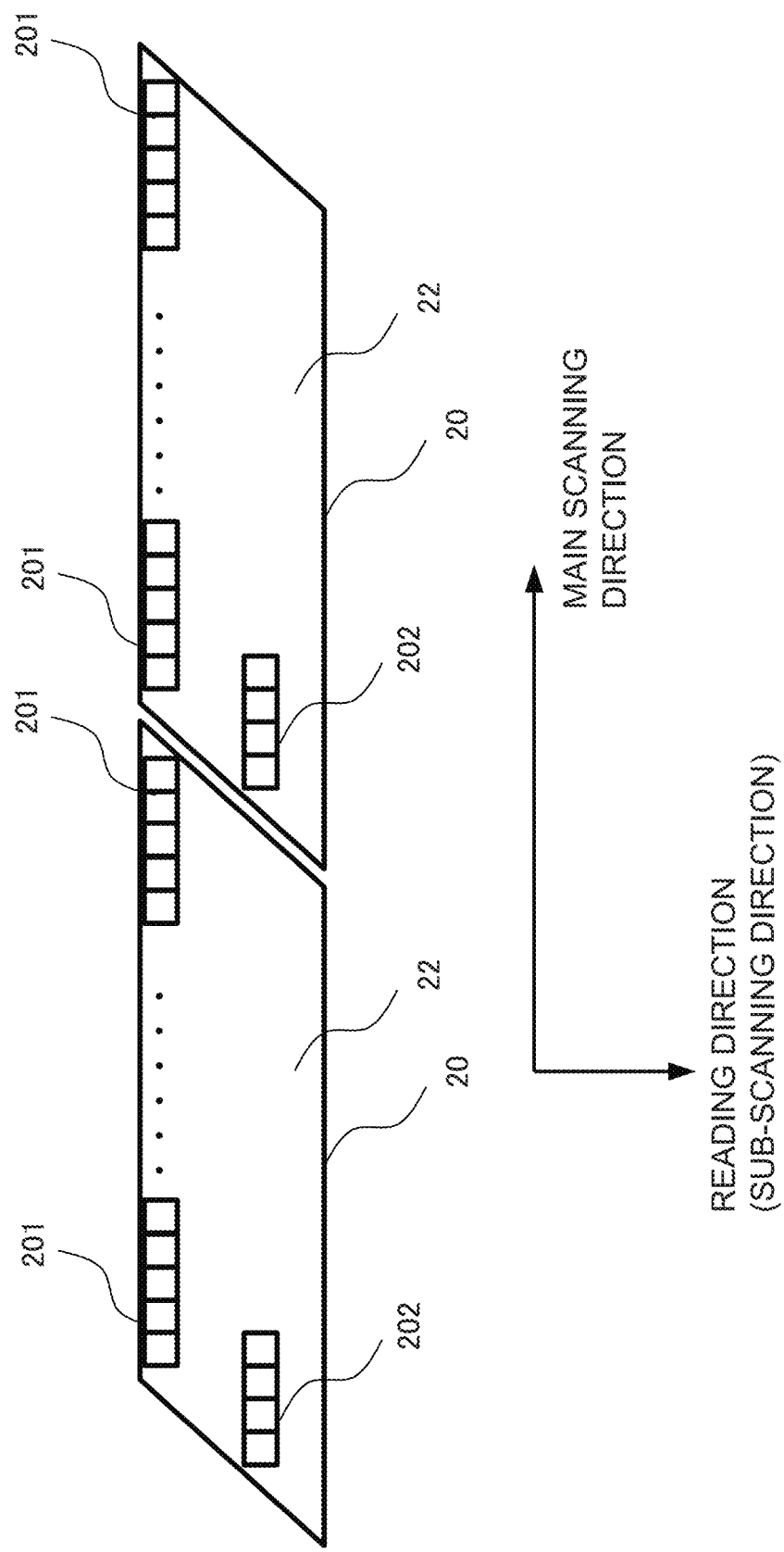
FIG. 2 is an outline drawing of photoelectric conversion elements according to Embodiment 1.

FIG. 2 is an outline view of the photoelectric conversion elements 20. As illustrated in FIG. 2, each of the photoelectric conversion elements 20 is a solid-state image sensor in which first pixels 201 that perform photoelectric conversion are arranged on the parallelogram-shaped semiconductor substrate 22 having a pair of long sides parallel to each other and a pair of short sides parallel to each other. There is a gap between a short side of one of the parallelogram shapes of adjacent photoelectric conversion elements 20 and a short side of the other of the parallelogram shapes, and the gap is a fixed distance necessary for mounting. The long sides of the parallelogram extend in the main scanning direction that is a direction perpendicular to the reading direction.

The first pixels 201 that perform photoelectric conversion are arrayed in a line at a constant pixel pitch A along one of the long sides of the parallelogram. The pixel pitch A is determined in accordance with resolution. For example, when the resolution is 600 dpi, the pixel pitch A is 42.3 μm.

Figure 3:
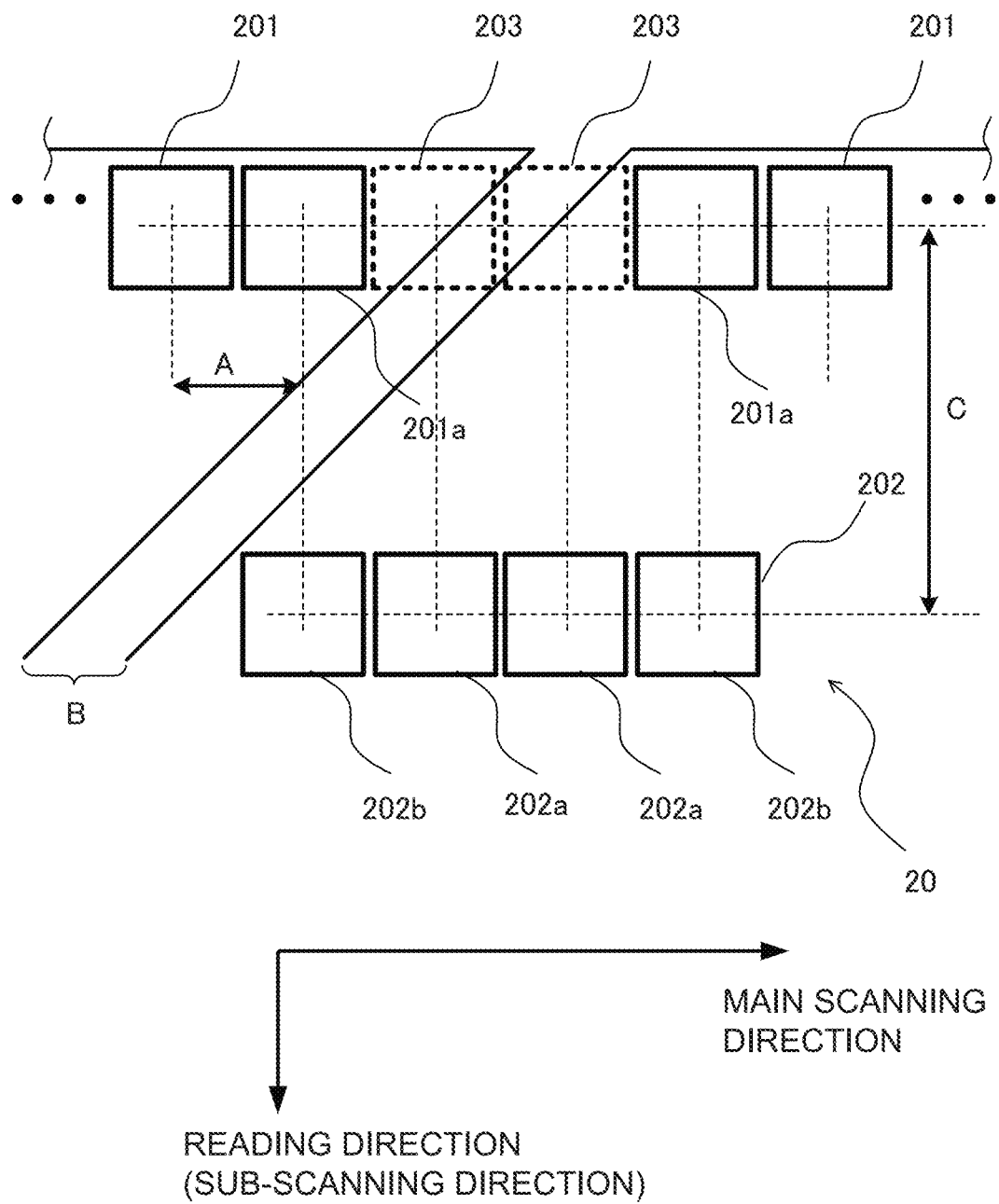
FIG. 3 is an enlarged view illustrating missing pixels and interpolation pixels in the photoelectric conversion element according to Embodiment 1.

Each of the photoelectric conversion elements 20 further includes second pixels 202 arrayed away from the line of the first pixels 201. FIG. 3 is an enlarged view illustrating missing pixels 203 and interpolation pixels 202a in each of the photoelectric conversion elements 20. As illustrated in FIG. 3, when the semiconductor substrate 22 of each of the photoelectric conversion elements 20 is mounted on the sensor substrate 21, a gap B of a certain distance occurs between the short sides of adjacent photoelectric conversion elements 20. When the first pixels 201 are arrayed on a straight line in the main scanning direction, a missing pixel 203 in the main scanning direction occurs in the gap B occurring by mounting.

The second pixels 202 include an interpolation pixel 202a for interpolating the missing pixels 203 of the first pixels 201. The second pixels 202 are arrayed linearly at a predetermined interpolation pixel distance C from the line of the first pixels 201 in the reading direction perpendicular to the arrangement direction of the first pixels 201. The second pixels 202 include interpolation pixels 202a that overlap the missing pixels 203 and overlapping pixels 202b that overlap the outermost pixels 201a of the first pixels 201 when viewed in the reading direction from above in FIG. 3.

That is, both of the line of the first pixels 201 and the line of the second pixels 202 are arranged in parallel with the long sides of the parallelogram of the semiconductor substrate 22 and are separated away from each other by the predetermined interpolation pixel distance C in the reading direction perpendicular to the long sides. Also, when a line that passes through one of the first pixels 201 and extends in the reading direction is called a sub-scanning line, the overlapping pixels 202b exist on the sub-scanning lines passing through the outermost pixels 201a that are located at ends of the linear array of the first pixels 201 and are the nearest to the short sides. Also, the interpolation pixels 202a exist on other sub-scanning lines passing through the missing pixels 203. In this case, the missing pixels 203 are located farther away from the center of the linear arrays of the first pixels 201 than the outermost pixels 201a. The second pixels 202 including the interpolation pixels 202a and the overlapping pixels 202b are arrayed linearly, in parallel with the long sides, from an end near to one of the short sides in a direction away from the one of the short sides.

Figure 4:
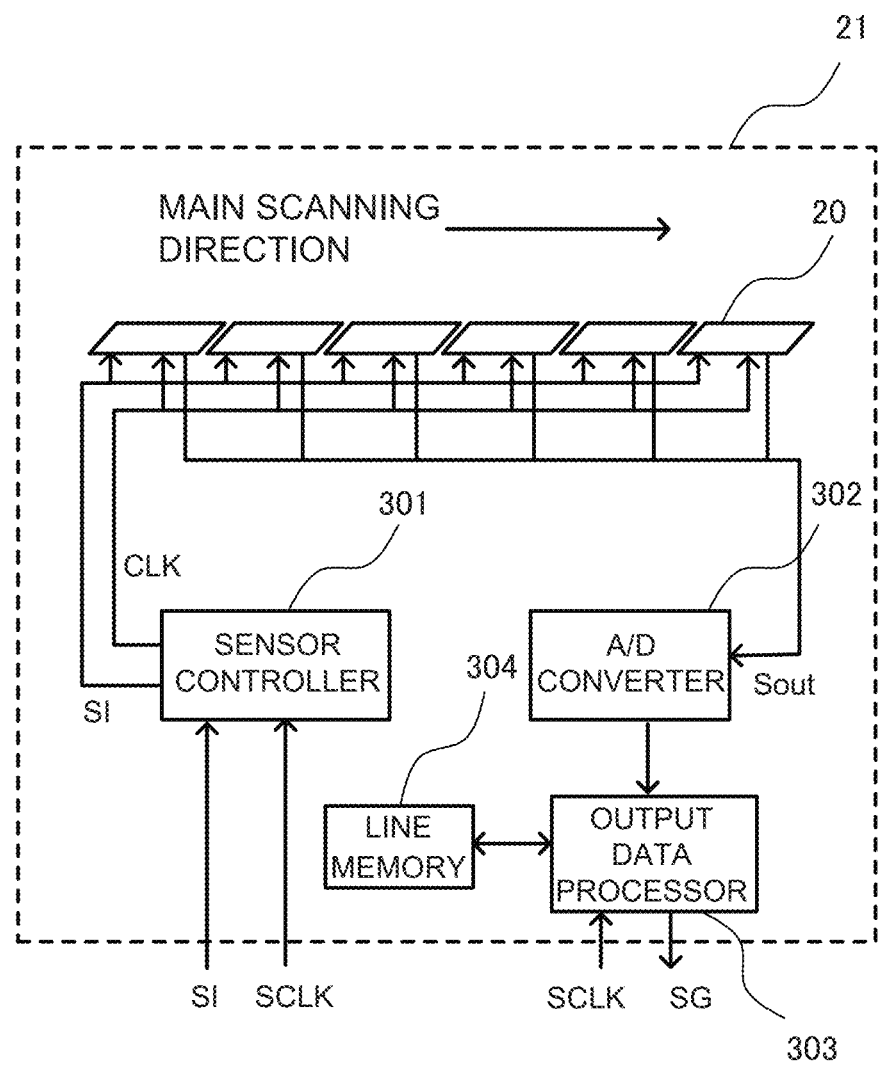
FIG. 4 is a block diagram of a drive circuit of the light receiving unit according to Embodiment 1.

FIG. 4 is a block diagram of a drive circuit of the light receiving unit 1. The light receiving unit 1 includes a sensor controller 301 that controls the output timing of the photoelectric conversion element 20 on the sensor substrate 21. Also, the light receiving unit 1 includes (i) an analog/digital (A/D) converter 302 that performs digital conversion of analog signals output by the photoelectric conversion element 20, (ii) an output data processor 303 that generates image data (SG) by performing signal processing of a digital signal output by the A/D converter 302 and outputs the image data, and (iii) a line memory 304 that temporarily stores the image data.

The sensor controller 301, the A/D converter 302, the output data processor 303, and the line memory 304 may be realized by a freely-selected hardware configuration, and, for example, these components may be integrated with one another using an application specific integrated circuit (ASIC).

The sensor controller 301 generates a readout clock signal (CLK) based on an external clock signal (SCLK) and outputs the readout clock signal to each of the photoelectric conversion elements 20. Also, the sensor controller 301 sequentially outputs, to each of the photoelectric conversion elements 20 at an output timing of each of the photoelectric conversion elements 20, a shift signal (SI) synchronized with the clock signal.

Based on the shift signal input from the sensor controller 301, each of the photoelectric conversion elements 20 (i) sequentially switches an output switch mounted therein and (ii) sequentially outputs an analog signal (Sout) obtained by photoelectrically converting received light. The A/D converter 302 (i) performs digital conversion of the analog signal (Sout) output by each of the photoelectric conversion elements 20 and (ii) outputs the converted signal to the output data processor 303.

The output data processor 303 temporarily stores, in the line memory 304, image data that is subjected to signal processing including correction processing or data rearrangement processing. The image data stored in the line memory 304 includes image data based on analog signals (Sout) output by the first pixels 201 and the second pixels 202 of the photoelectric conversion elements 20.

The output data processor 303 performs signal processing including time correction of the image data stored in the line memory 304, generates corrected image data (SG), and outputs the generated image data (SG) to the outside. Since the image data to be output to the outside is a signal of one line, a visible image can be obtained by outputting the image data by continuously performing scanning operation of the photoelectric conversion elements 20 while relatively conveying the image reading target 2.

The operation of the light receiving unit 1 configured as described above is described.

The image reading target 2 is conveyed relative to the light receiving unit 1. At this time, light emitted from the light source 11 is guided by the light guide 14, and the light emitted from the light guide 14 is emitted to the image reading target 2. Reflected light reflected from the image reading target 2 enters the first pixels 201 and the second pixels 202 of the photoelectric conversion elements 20. The first pixels 201 and the second pixels 202 photoelectrically convert the received optical signals and output the converted signals.

The first pixels 201 and the second pixels 202 of the photoelectric conversion elements 20 are sequentially scanned in the main scanning direction by using, as a trigger, the shift signal (SI) input from the sensor controller 301. Specifically, based on the shift signal input from the sensor controller 301, each of the photoelectric conversion elements 20 (i) sequentially switches output switches provided therein and (ii) sequentially outputs the analog signal (Sout) obtained by photoelectrically converting received light.

The A/D converter 302 (i) performs digital conversion of the analog signal (Sout) output by each of the photoelectric conversion elements 20 and (ii) outputs the converted signal to the output data processor 303. The output data processor 303 temporarily stores, in the line memory 304, image data generated based on an input digital signal. Also, the output data processor 303 (i) performs signal processing including time correction of the image data stored in the line memory 304 and (ii) outputs the corrected image data (SG) to the outside.

Figure 5:
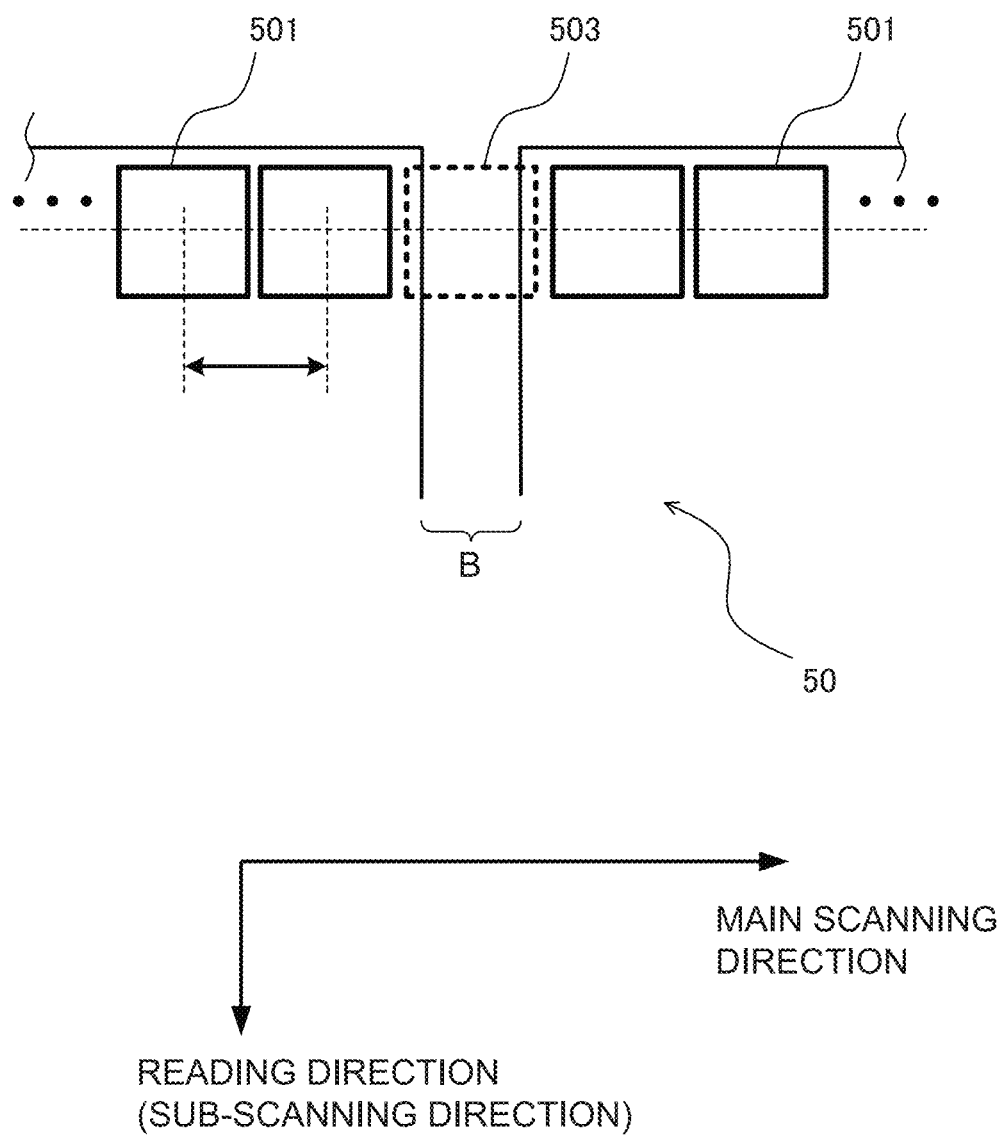
FIG. 5 is an enlarged view illustrating a missing pixel and an interpolation pixel in a conventional photoelectric conversion element.

As illustrated in FIG. 5, in conventional photoelectric conversion elements 50 each having a rectangular outer shape, a missing pixel 503 occurs in a gap B between adjacent photoelectric conversion elements 50, thereby causing image information to be missing. In this case, correction processing is performed by predicting a pixel value of the missing portion from the surrounding pixels. FIG. 5 is an enlarged view illustrating the missing pixel and an interpolation pixel in the conventional photoelectric conversion elements.

As illustrated in FIG. 2, the outer shape of the photoelectric conversion elements 20 according to Embodiment 1 is a parallelogram, and the first pixels 201 is arrayed along one of the long sides and the second pixels 202 are arranged at a location separated away from the first pixels 201 by a predetermined distance. Since the semiconductor substrate 22 of each of the photoelectric conversion elements 20 has sides that are tilted with respect to the reading direction, the interpolation pixels 202a that are a part of the second pixels 202 can be arranged at positions that enable interpolation of the missing pixels 203 that exist on the line of the first pixels 201.

The interpolation pixel distance C between a line passing through the centers of the first pixels 201 and a line passing through the centers of the second pixels 202 is n times the pixel pitch A (n is a positive integer). Although the number n may be a freely-selected positive integer, the smallest number is desirable as the number n in consideration of various restrictions including scanning time and mounting process.

Next, the time correction processing performed by the output data processor 303 is described.

Since the first pixels 201 and the second pixels 202 are sequentially scanned using, as a trigger, a shift signal input from the sensor controller 301, output data from the first pixels 201 and the second pixels 202 of the photoelectric conversion elements 20 is output continuously.

Figure 6:
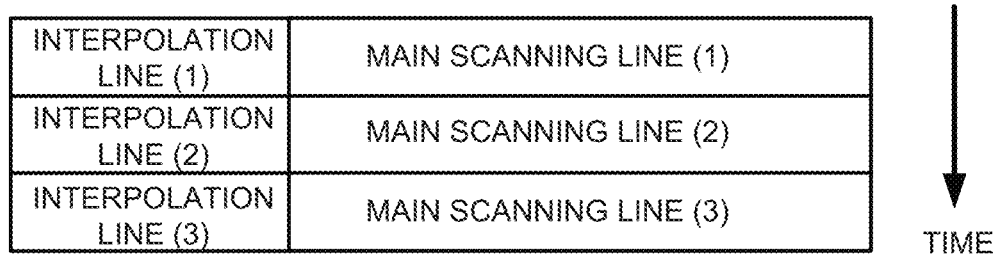
FIG. 6 is an image illustrating image data array during image reading.

FIG. 6 is a conceptual view illustrating image data array during image reading. As illustrated in FIG. 6, in the data output by the photoelectric conversion elements 20, a main scanning line (1) scanned by the first pixels 201 and an interpolation line (1) scanned by the second pixels 202 are successively output. However, in reality, the interpolation line (1) scanned by the second pixels 202 is data of a location separated away by the interpolation pixel distance C, that is, data of a location shifted by n lines. In other words, data of the interpolation line (1) scanned by the second pixels 202 corresponds to data of the main scanning line (4) scanned by the first pixels 201 at a time that is later by a scanning period for scanning n lines.

Accordingly, the output data processor 303 performs, on the image data obtained by converting by the A/D converter 302 the signals output by the first pixel 201 and the second pixel 202 into digital signals, time correction processing in which image data of the first pixels 201 and image data of the second pixels 202 that are shifted relative to each other by the n line scan period are coupled.

Figure 7:
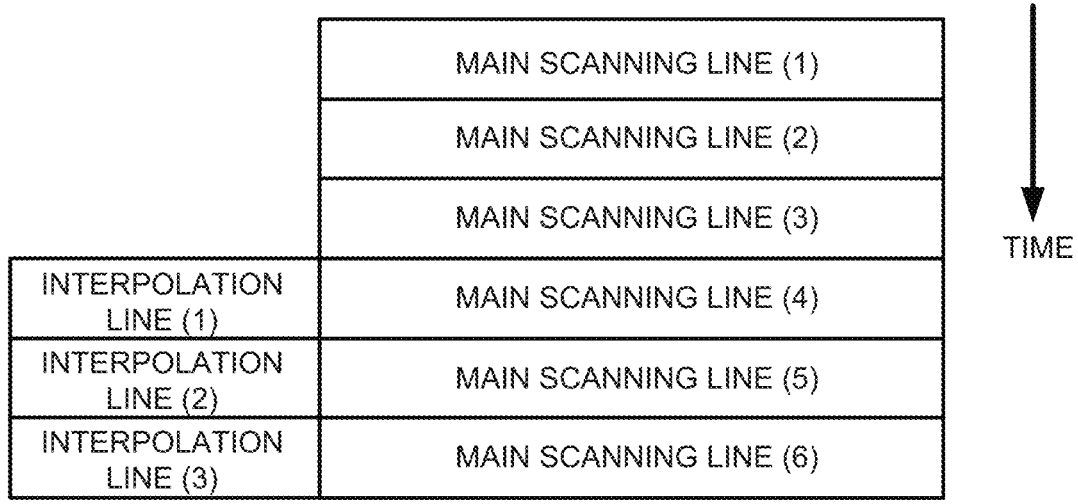
FIG. 7 is an image illustrating pixel data array after time correction.

FIG. 7 is a conceptual view illustrating the pixel data array after time correction and illustrates a case in which the number n is 3. In this case, the interpolation pixel distance C between the first pixels 201 and the second pixels 202 is three times the pixel pitch A. Accordingly, the output data processor 303 shifts data of the interpolation lines by three line scanning periods and couples the shifted data with the data of the main scanning lines. For example, the image data of the main scanning line (4) and the image data of the interpolation line (1) are combined.

In this case, the second pixels 202 include the overlapping pixels 202b that overlap the first pixels 201 when viewed in the reading direction. Since the second pixels 202 include the overlapping pixel 202b, the missing pixels 203 can be interpolated even when the width of the gap B changes depending on an operating temperature of the light receiving unit 1. Also, comparison between the outermost pixels 201a of the first pixels 201 and the overlapping pixels 202b of the second pixels 202 enables determination as to whether the interpolation is properly performed.

As described above, the output data processor 303 can perform the interpolation processing of the missing pixels 203 using the data actually measured by the second pixels 202, and thus accurate image data without the missing pixels 203 can be obtained.

Also, by setting the interpolation pixel distance C between the first pixels 201 and the second pixels 202 to be a number obtained by multiplying the pixel pitch A by a positive integer, the pixel data of the second pixels 202 can be used as is, thereby enabling easy and accurate time correction processing. When the positions of the interpolation pixels do not depend on a number obtained by multiplying the pixel pitch A by a positive integer, the scanning time of the first pixels 201 and the scanning time of the second pixels 202 that is subjected to the time correction are not sequential, and the process of predicting from image data of the second pixels 202 of preceding and following lines must be performed, thereby complicating the processing and reducing the correction accuracy.

As described above, the light receiving unit 1 according to Embodiment 1 includes the photoelectric conversion elements 20 in which (i) the first pixels 201 are arrayed linearly along one of the long sides of the parallelogram-shaped semiconductor substrate 22, and (ii) the second pixels 202 are arrayed linearly at a location separated from the first pixels 201 by the predetermined interpolation pixel distance C. The output data processor 303 couples image data based on the output of the second pixels 202 with image data based on the output of the first pixels 201 having a time lag of the scanning period corresponding to the interpolation pixel distance C, thereby performing time correction of the image data. As a result, accurate image data can be obtained without missing pixels to be read, and time correction processing is easily performed.

Figure 8:
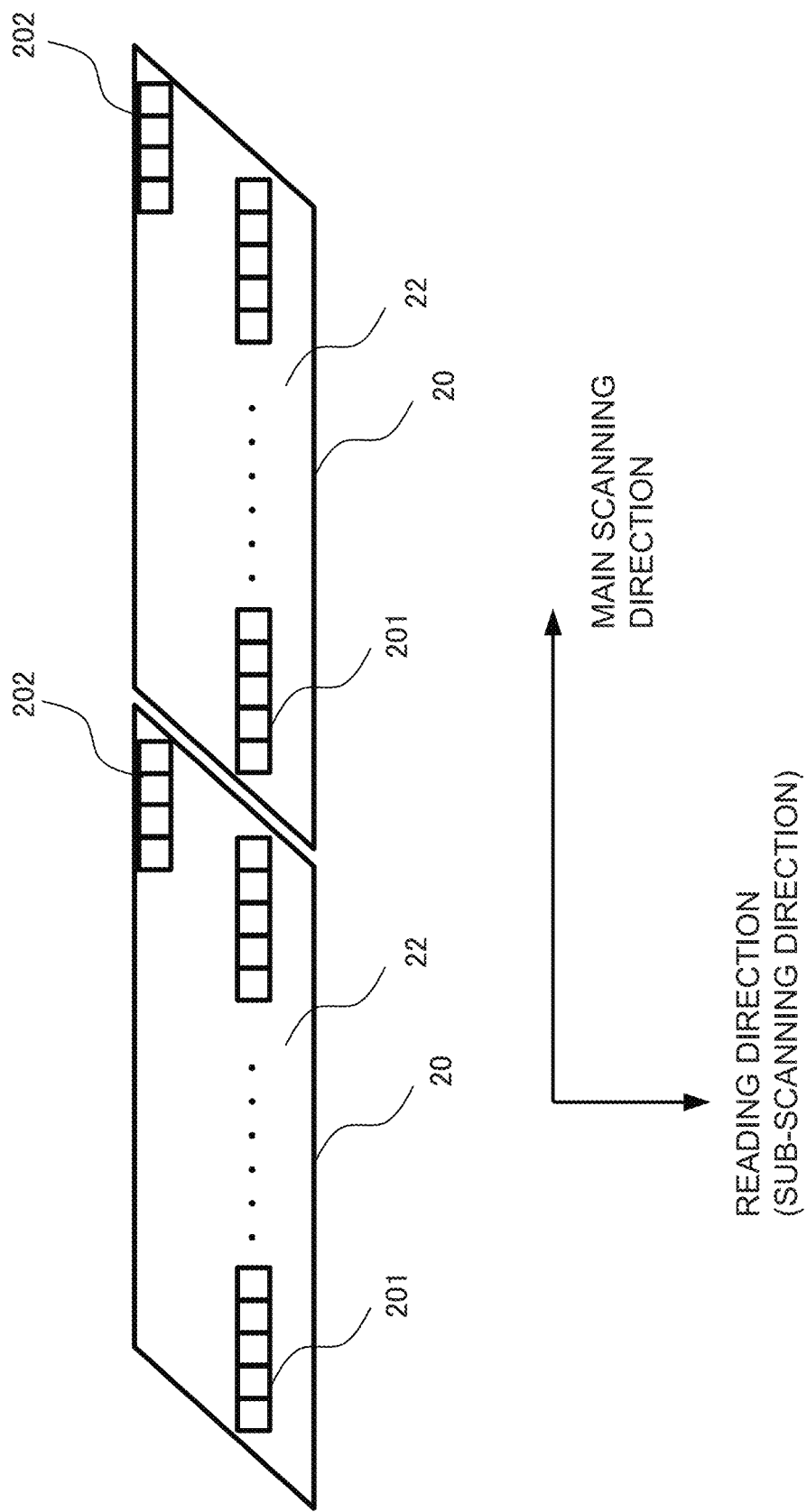
FIG. 8 is an outline drawing illustrating photoelectric conversion elements of another example.

In Embodiment 1 described above, the first pixels 201 are arrayed linearly along the long sides of the parallelogram. However, as illustrated in FIG. 8, the second pixels 202 may be arrayed linearly along the long sides of the parallelogram, and the first pixels 201 may be arranged at positions that are separated away from the second pixels 202 by the interpolation pixel distance C and that are near the center of the semiconductor substrate 22. Also in this case, the first pixels 201 and the second pixels 202 are arrayed linearly in parallel with the long sides.

Embodiment 2

The light receiving unit 1 according to Embodiment 2 has the same configuration as that of Embodiment 1. The photoelectric conversion element 20 included in the light receiving unit 1 according to Embodiment 2 has a characteristic configuration not described in Embodiment 1.

The photoelectric conversion element 20 includes reading circuits 205 in addition to the configuration described in Embodiment 1. In the photoelectric conversion element 20, each of the reading circuits 205 (i) scans the interpolation pixels 202a and the first pixels 201 sequentially from the left end in the main scanning direction and (ii) reads a signal of each pixel. Additionally, each of the reading circuits 205 (i) performs signal processing on the signal read from each pixel and (ii) outputs the processed signal to the A/D converter 302 described in FIG. 4.

The reading circuits 205 are block circuits in which channel circuits 204 are arrayed in the main scanning direction, and the number of the arrayed channel circuits 204 is equal to the sum of the number of the interpolation pixels 202a and the number of the first pixels 201. The respective channel circuits 204 are connected to the interpolation pixels 202a and the first pixels 201 by metal wiring 206 in order from the left end of each of the photoelectric conversion elements 20.

Figure 9:
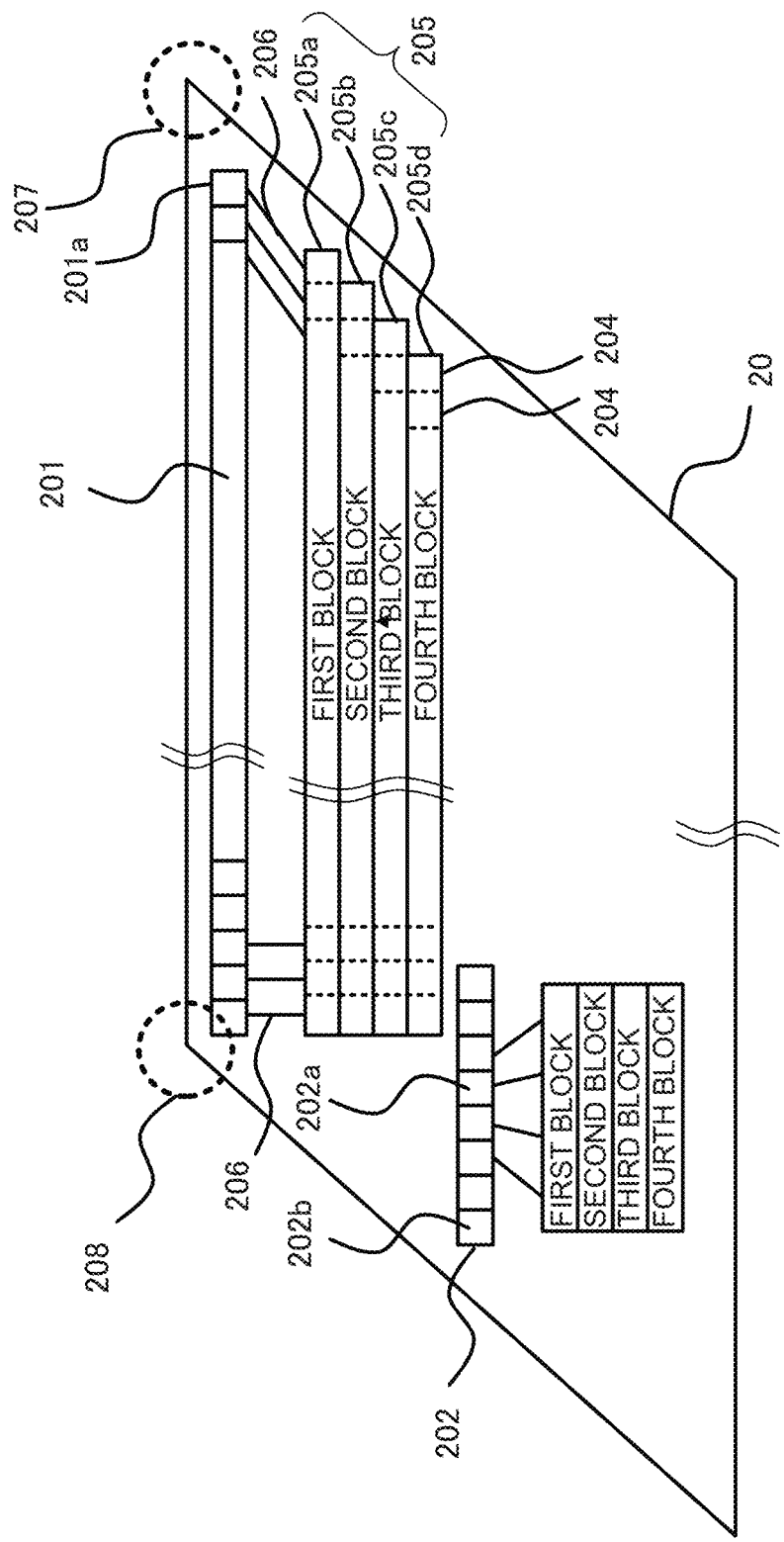
FIG. 9 is a view illustrating a circuit configuration of a photoelectric conversion element according to Embodiment 2.

The reading circuits 205 includes block circuits that are different from one another in function. FIG. 9 is a view illustrating the reading circuits 205 that includes four block circuits. The four block circuits are a first block 205a, a second block 205b, a third block 205c, and a fourth block 205d.

The first block 205a is connected to the interpolation pixels 202a and the first pixels 201, and the first block 205a and the second block 205b are connected to each other. Similarly, the third block 205c and the fourth block 205d are sequentially connected to corresponding channels. Each of the block circuits has a freely-selected function, for example, such as signal amplification and charge retention functions. The block circuits are connected to one another by wiring including the metal wiring 206 for each corresponding channel.

As illustrated in FIG. 9, the acute angle 207-side right end portion of the first block 205a is staggered relative to the block circuits other than the first block 205a in the main scanning direction such that the right end portion of the first block 205a is located near a short side that is an acute angle 207-side right short side of the semiconductor substrate 22. FIG. 9 illustrates a circuit configuration of each of the photoelectric conversion elements 20 according to Embodiment 2. Similarly, the second block 205b is staggered relative to the third block 205c in the main scanning direction such that the acute angle 207-side right end portion of the second block 205b is located near the right edge side of the semiconductor substrate 22. Additionally, the acute angle 207-side right end portion of the third block 205c is staggered relative to the fourth block 205d in the main scanning direction such that the right end portion of the third block 205c is located near the right edge side of the semiconductor substrate 22. That is, the acute angle 207-side right end portions of the first block 205a, the second block 205b, the third block 205c, and the fourth block 205d are arranged like stairs.

Figure 10:
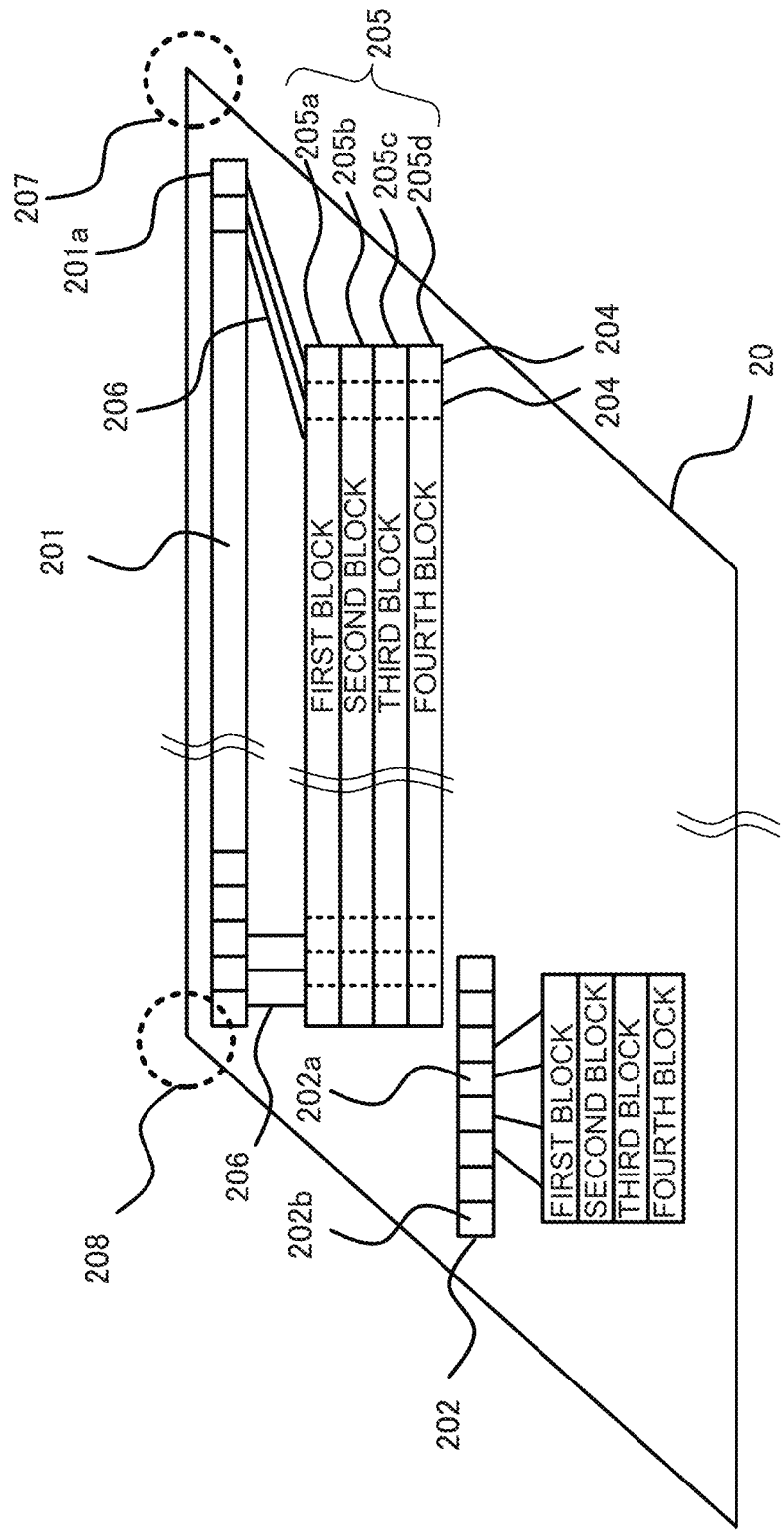
FIG. 10 is a view illustrating a circuit configuration of the conventional photoelectric conversion element.

The effect of such an arrangement is explained. Conventionally, as illustrated in FIG. 10, the reading circuit 205 has a configuration in which the reading circuit 205 cannot be arranged near the acute angle 207-side edge side, and all ends of the first to fourth blocks are aligned in the main scanning direction. FIG. 10 illustrates a circuit configuration of a conventional photoelectric conversion element 20.

As illustrated in FIG. 10, in the photoelectric conversion element 20 having the conventional circuit arrangement, the first block 205a, the second block 205b, the third block 205c, and the fourth block 205d of the reading circuits 205 are arranged in a straight line such that the right end portions of the first to fourth blocks are aligned. In this case, since the reading circuit 205 cannot be arranged in the vicinity of the acute angle 207, the length of a wire connecting a first pixel 201 of a channel near the acute angle 207 and the first block 205a becomes longer than that for a channel far from the acute angle 207 and the first block 205a. For this reason, an output of the pixel of the channel near the acute angle 207 is lower than an output of a pixel of the channel far from the acute angle 207. That is, there is a problem in that differences arise in the output according to pixel position in the pixel data.

On the other hand, as illustrated in FIG. 9, the reading circuit 205 according to Embodiment 2 is arranged such that arrangement positions of the first, second, third and fourth blocks 205a to 205d are shifted relative to one another and the first, second, third and fourth blocks are located near the short side that is the acute angle 207-side right edge side. As a result, the difference between the lengths of wires connecting the pixels is decreased, and the conventional difference in output can be reduced. In addition, although an obtuse angle 208-side left end portion of each block circuit may be arranged near a short side that is an obtuse angle 208-side left short side as well as the acute angle 207 side, the left end portion of each block circuit may not be arranged near the obtuse angle 208-side left short side since the lengths of wires on the obtuse angle 208 side do not vary significantly.

As described above, the photoelectric conversion element 20 of the light receiving unit 1 according to Embodiment 2 further includes the reading circuit 205 that reads signal of each pixel and performs signal processing. The block circuits of the reading circuits 205 are staggered in the long side direction such that the right end portions of the block circuits are located near the acute angle 207-side right side. As a result, the difference in length between the wires connecting to the pixels decreases, and the difference in output can be reduced.

Figure 11:
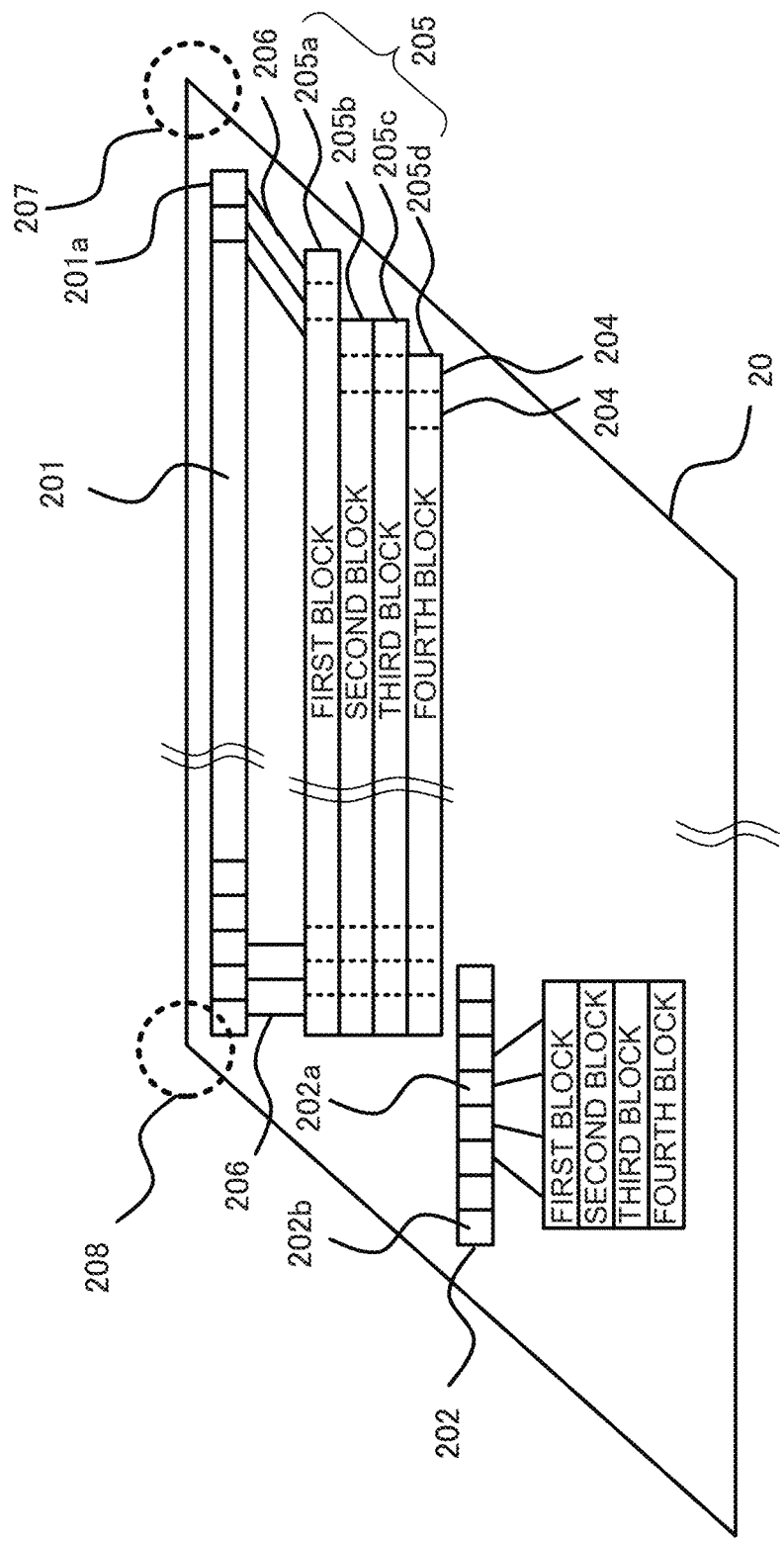
FIG. 11 is a view illustrating a circuit configuration of a photoelectric conversion element of another example.

Also, the light receiving unit 1 according to Embodiment 2 may be configured such that all the block circuits are not arranged like stairs and such that, as illustrated in FIG. 11, the right end portions of some of the block circuits are lined up. FIG. 11 is a view illustrating a circuit configuration of a photoelectric conversion element 20 of another example and illustrates an example in which the right end portions of the second block 205b and the third block 205c are lined up. Either a staggered stair-like arrangement of the right end portions of block circuits or an aligned arrangement in which the right end portions of the block circuits are lined up may be selected depending on the function of each block circuit. The stair-like arrangement as illustrated in FIG. 9 also has demerits such as interference between wires and an increase in area for securing of the wiring region. A configuration in which both the staggered arrangement and the aligned arrangement are appropriately selected can reduce the overall difference in output and is more advantageous than the all stairs-like arrangement, regarding the interference between wires or the area of wiring region.

Embodiment 3

Figure 12:
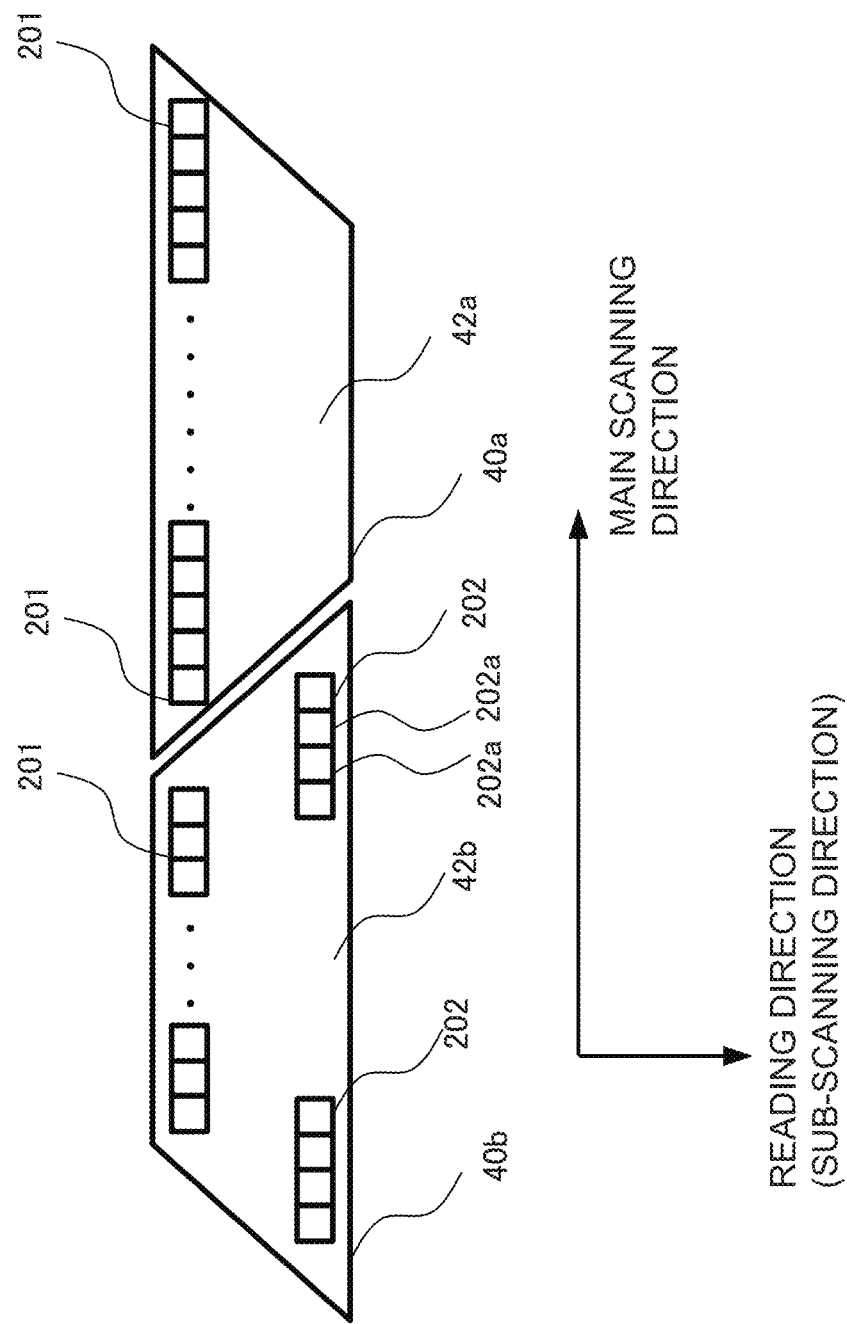
FIG. 12 is an outline drawing illustrating photoelectric conversion elements according to Embodiment 3.

Although a light receiving unit 1 according to Embodiment 3 has a configuration similar to that of Embodiment 1, the light receiving unit 1 according to Embodiment 3 is different from that of Embodiment 1 only in configuration of the photoelectric conversion elements 40a and 40b. Unlike Embodiments 1 and 2, the shape of the semiconductor substrates 42a and 42b of the photoelectric conversion elements 40a and 40b included in the light receiving unit 1 according to Embodiment 3 are not a parallelogram but are a trapezoid. That is, as illustrated in FIG. 12, the semiconductor substrates 42a and 42b of the photoelectric conversion elements 40a and 40b have a trapezoid-like shape having (i) a pair of sides that extend in the main scanning direction and are parallel to each other and (ii) a pair of slanted sides that are symmetric with respect to a straight line of symmetry extending in the sub-scanning direction. FIG. 12 is an outline drawing of the photoelectric conversion elements 40a and 40b according to Embodiment 3.

As illustrated in FIG. 12, the first pixels 201 are arrayed linearly along one side of a pair of sides parallel to the main scanning direction, as in Embodiments 1 and 2. The second pixels 202 are arrayed linearly in the main scanning direction from an end near the slanted sides, between a pair of sides parallel to the main scanning direction, and at a location spaced away from the first pixels 201 by a predetermined distance.

The pair of the sides of each of the semiconductor substrates 42a and 42b that are parallel to each other in the main scanning direction is a short side and a long side. The adjacent photoelectric conversion elements 40a and 40b are different from each other in the method of arranging the first pixels 201 and the second pixels 202. The first pixels 201 of the photoelectric conversion element 40a are arrayed linearly along the long side of the photoelectric conversion element 40a, and the first pixels 201 of the photoelectric conversion element 40b are arrayed linearly along the short side of the photoelectric conversion element 40b. Additionally, the second pixels 202 including the interpolation pixels 202a are arrayed linearly in the photoelectric conversion element 40b, at a location separated from the first pixels 201 by a predetermined distance, from both ends near to the slanted sides toward an area away from the slanted sides.

By arraying linearly such photoelectric conversion elements 40a and 40b alternately in the main scanning direction, a line of the first pixels 201 and a line of the second pixels 202 partially overlap with each other when viewed in the sub-scanning direction. That is, the missing pixels 203 of the first pixels 201 can be interpolated by the interpolation pixels 202a of the second pixels 202.

As described above, the light receiving unit 1 according to Embodiment 3 has a structure in which the photoelectric conversion elements 40a and 40b, in which the first pixels 201 or the second pixels 202 are arrayed linearly on the trapezoid-shaped semiconductor substrates 42a and 42b, are alternately arrayed. In the photoelectric conversion element 40a, the first pixels 201 are arrayed linearly along the long side of the semiconductor substrate 42a. Also, in the photoelectric conversion element 40b, the first pixels 201 are arrayed linearly along the short side of the semiconductor substrate 42b, and the second pixels 202 including the interpolation pixels 202a are arrayed linearly, in the main scanning direction from both ends near to the slanted sides, at the location separated away from the first pixels 201 by the predetermined distance. As a result, another method capable of obtaining accurate image data without missing a pixel to be read can be provided.

Embodiment 4

Figure 13:
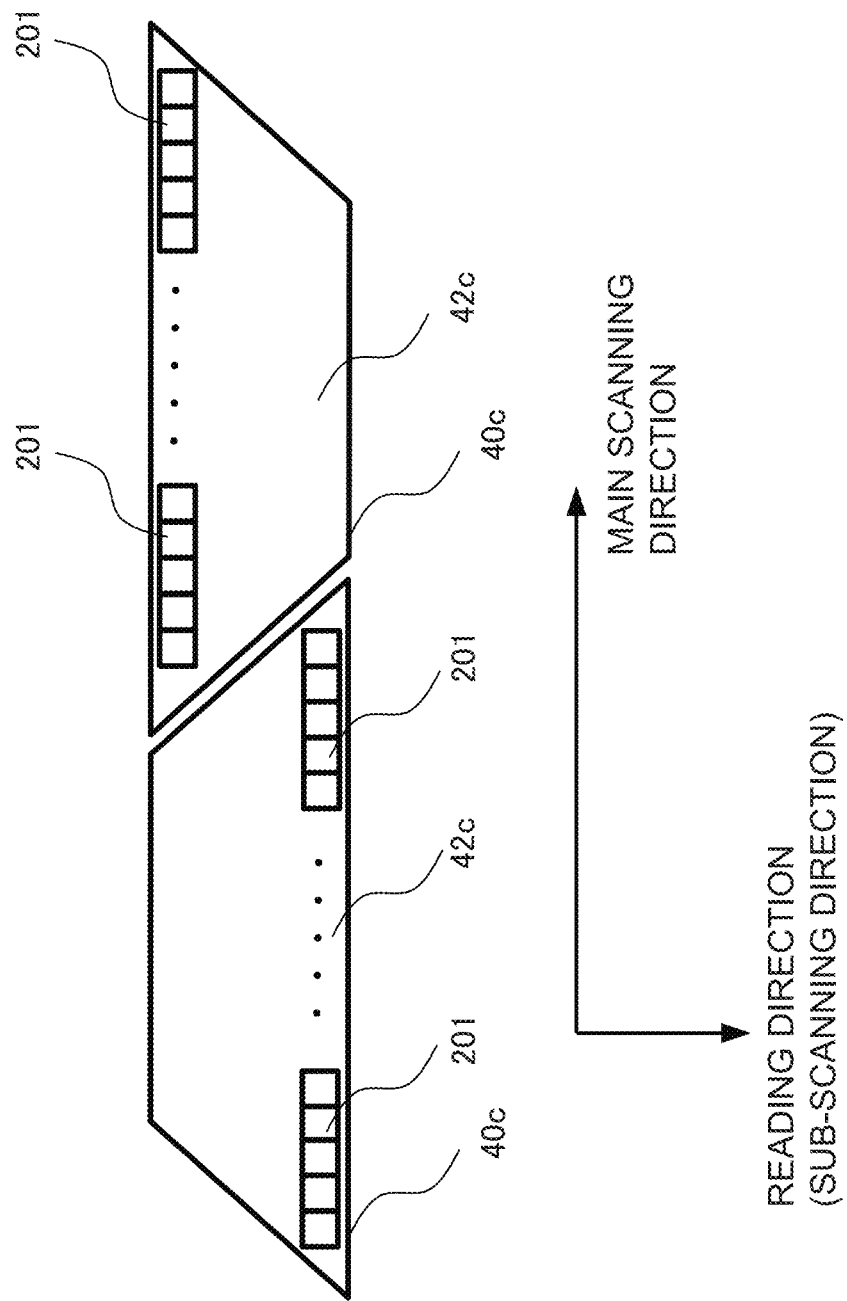
FIG. 13 is an outline drawing illustrating photoelectric conversion elements according to Embodiment 4.

A light receiving unit 1 according to Embodiment 4 has a configuration similar to that of Embodiment 1, differing only in the configuration of the photoelectric conversion elements 40c. The shapes of the semiconductor substrates 42c of the photoelectric conversion elements 40c included in the light receiving unit 1 according to Embodiment 4 are trapezoidal as in Embodiment 3. FIG. 13 is an outline drawing of the photoelectric conversion elements 40c according to Embodiment 4.

As illustrated in FIG. 13, the first pixels 201 are arrayed linearly along a long side of a pair of sides of the trapezoid-shaped semiconductor substrate 42c that are parallel to the main scanning direction. The second pixels 202 are not arrayed.

The pair of parallel sides of each of the semiconductor substrates 42c is a short side and a long side. Two or more photoelectric conversion elements 40c adjacent in the main scanning direction have the same configuration but are different from one another in arrangement direction. The adjacent photoelectric conversion elements 40c are arranged to be vertically inverted relative to each other in the sub-scanning direction.

As described above, by arranging the photoelectric conversion elements 40c to be alternately inverted vertically in the sub-scanning direction, a line of the first pixels 201 of one of the adjacent photoelectric conversion elements 40c partially overlaps with a line of the first pixels 201 of the other of the adjacent photoelectric conversion elements 40c when viewed in the sub-scanning direction. That is, the missing pixel 203 of the first pixels 201 arrayed on one of the two adjacent semiconductor substrates 42c can be interpolated by a first pixel 201 arrayed on the other of the two adjacent semiconductor substrate 42c. That is, the first pixel 201 on one semiconductor substrate 42c functions as a second pixel 202 that interpolates the missing pixel 203 of the first pixels 201 on the other semiconductor substrate 42c.

Accordingly, in Embodiment 4, pixel interpolation can be performed using just the first pixel 201, and the configurations of the photoelectric conversion elements 40c are simplified. Also, one type of photoelectric conversion elements 40c can be used, and the number of types of components can be reduced as compared with Embodiment 3.

As described above, the light receiving unit 1 according to Embodiment 4 has the configuration in which the photoelectric conversion elements 40c in which only the first pixels 201 are arrayed linearly along the long side of the trapezoid-shaped semiconductor substrate 42c are arranged to be alternately inverted vertically in the sub-scanning direction. As a result, accurate image data can be obtained with a simple configuration and without missing pixels to be read.

Embodiment 5

Figure 14:
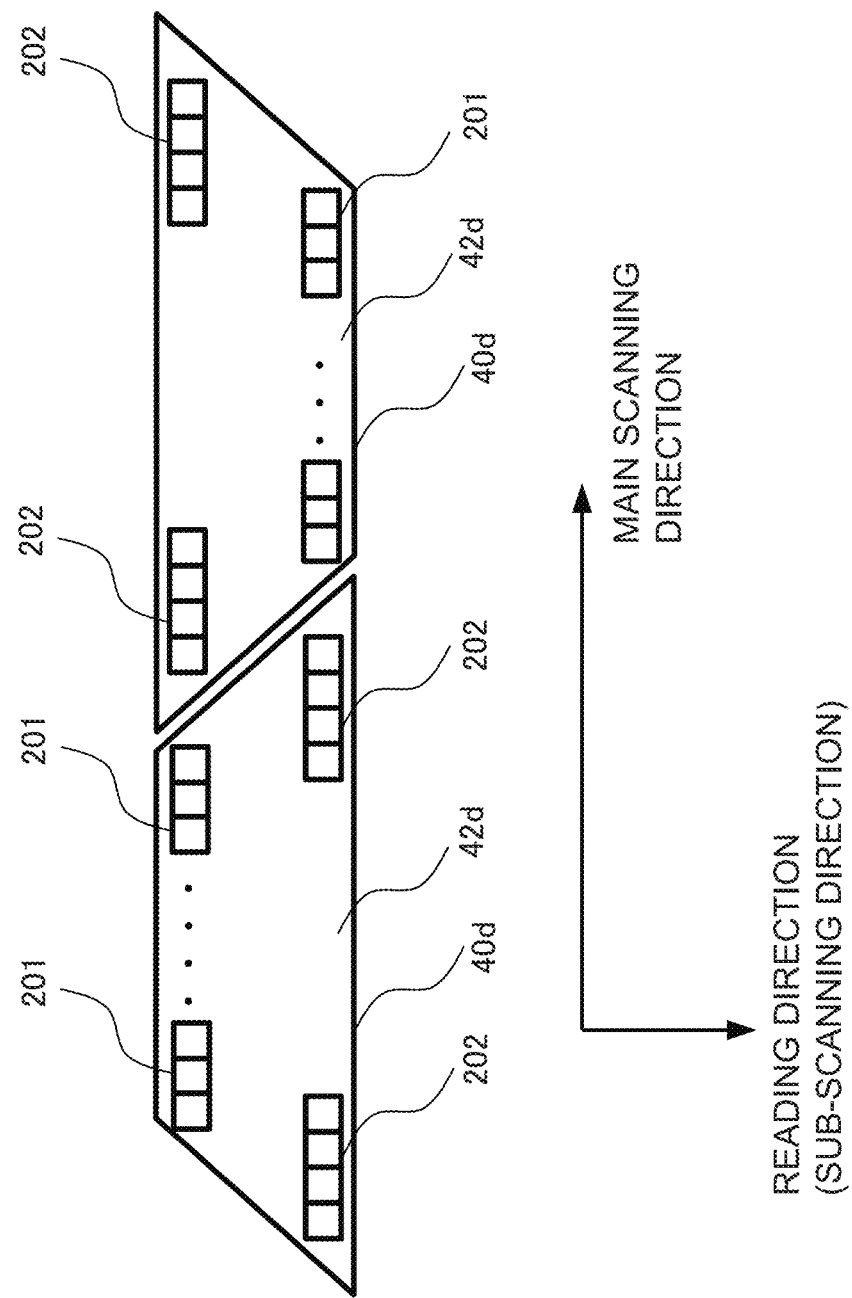
FIG. 14 is an outline drawing illustrating photoelectric conversion elements according to Embodiment 5.

A light receiving unit 1 according to Embodiment 5 has a configuration similar to that of Embodiment 1. However, the light receiving unit 1 according to Embodiment 5 is different from that of Embodiment 1 only in configurations of the photoelectric conversion elements 40d. The shapes of the semiconductor substrates 42d of the photoelectric conversion elements 40d included in the light receiving unit 1 according to Embodiment 5 are trapezoidal as in Embodiment 3. FIG. 14 is an outline drawing of the photoelectric conversion elements 40d according to Embodiment 5.

As illustrated in FIG. 14, the first pixels 201 are arrayed linearly along a short side of a pair of sides of each of the trapezoid-shaped semiconductor substrates 42d that are parallel to the main scanning direction. The second pixels 202 including an interpolation pixel 202a are arranged between a pair of sides parallel to the main scanning direction, at a location separated away from the first pixels 201 by a predetermined distance, from both ends near to the slanted sides toward an area away from the slanted sides, and in parallel with the main scanning direction.

The pair of parallel sides of each of the semiconductor substrates 42d is a short side and a long side. Two or more photoelectric conversion elements 40d adjacent in the main scanning direction have the same configuration but are different from one another in arrangement direction. The adjacent photoelectric conversion elements 40d are arranged to be vertically inverted relative to each other in the sub-scanning direction.

As described above, by arranging the photoelectric conversion elements 40d to be alternately inverted vertically in the sub-scanning direction, when viewed in the sub-scanning direction, a line of the first pixels 201 and a line of the second pixels 202 of one of the photoelectric conversion elements 40d partially overlap each other, and a line of the second pixels 202 of one of two adjacent photoelectric conversion elements 40d also partially overlaps a line of the second pixels 202 of the other of the two adjacent photoelectric conversion elements 40d. That is, a missing pixel 203 of the first pixels 201 can be interpolated by the second pixels 202 of the two adjacent photoelectric conversion elements 40d.

Accordingly, in Embodiment 5, one type of photoelectric conversion element 40d having a configuration in which (i) the first pixels 201 are arrayed linearly on the short side and (ii) the second pixels 202 are arrayed linearly in the main scanning direction, at the location separated away from the first pixels 201 by the predetermined distance, and from both ends near to the slanted sides can be used, and thus the number of types of components can be reduced as compared with Embodiment 3.

Although the first pixels 201 are arranged along the short side of the semiconductor substrate 42a, the first pixels 201 may be shifted in the sub-scanning direction as long as overlap between the first pixels 201 the second pixels 202 can be realized. That is, the positions of the first pixels 201 may be separated from the short sides to be located near the second pixels 202.

As described above, the photoelectric conversion elements 40d of the light receiving unit 1 according to Embodiment 5 have the configuration in which (i) the first pixels 201 are arrayed linearly along the short sides of the trapezoid-shaped semiconductor substrate 42d, and (ii) the second pixels 202 are arrayed linearly in the main scanning direction at the location separated from the first pixels 201 by the predetermined distance and from both ends near to the slanted sides. Additionally, the photoelectric conversion elements 40d are arranged to be alternately inverted vertically in the sub-scanning direction. As a result, another method capable of obtaining accurate image data with a simple configuration and without missing pixels to be read can be provided.

As described above, according to the present disclosure, the first pixels are arrayed linearly on the semiconductor substrate having a shape including a pair of sides parallel to each other and in parallel with one side of the pair of sides, the second pixels are arrayed linearly away from the first pixels by the predetermined interpolation pixel distance and in parallel with the one side, and the second pixels include (i) the overlapping pixels that are located on the sub-scanning lines that are perpendicular to the one side and pass through outermost pixels located on the outermost ends of the linear array of the first pixels, and (ii) the interpolation pixels that are located on other sub-scanning lines that pass through the missing pixels located farther away from the center of the linear array of the first pixels than the outermost pixels. As a result, the image to be read can be read with high accuracy and without missing pixels to be read, and correction processing can be easily performed.

The foregoing describes some example embodiments for explanatory purposes. Although the foregoing discussion has presented specific embodiments, persons skilled in the art will recognize that changes may be made in form and detail without departing from the broader spirit and scope of the invention. Accordingly, the specification and drawings are to be regarded in an illustrative rather than a restrictive sense. This detailed description, therefore, is not to be taken in a limiting sense, and the scope of the invention is defined only by the included claims, along with the full range of equivalents to which such claims are entitled.

Although the shapes of the semiconductor substrates 22 of the photoelectric conversion elements 20 are a parallelogram in Embodiments 1 and 2 and the shapes of the semiconductor substrates 42a, 42b, 42c, and 42d of the photoelectric conversion elements 40a, 40b, 40c, and 40d are trapezoidal in Embodiments 3 to 5, for example, the semiconductor substrates may have other shapes as long as each of the other shapes of the semiconductor substrates includes a pair of sides parallel to each other.

This application claims the benefit of Japanese Patent Application No. 2018-099171, filed on May 23, 2018, the entire disclosure of which is incorporated by reference herein.

REFERENCE SIGNS LIST

1 Light receiving unit
2 Image reading target
11 Light source
12 Substrate
13 Flexible substrate
14 Light guide
15 Holder
16 Lens body
17 Housing
18 Transmissive body
20, 40a, 40b, 40c, 40d, 50 Photoelectric conversion element
21 Sensor substrate
22, 42a, 42b, 42c, 42d Semiconductor substrate
201, 501 First pixel
201a Outermost pixel
202 Second pixel
202a Interpolation pixel
202b Overlapping pixel
203, 503 Missing pixel
204 Channel circuit
205 Reading circuit
205a First block
205b Second block
205c Third block
205d Fourth block
206 Metal wiring
207 Acute angle
208 Obtuse angle
301 Sensor controller
302 A/D converter
303 Output data processor
304 Line memory
A Pixel pitch
B Gap
C Interpolation pixel distance

The invention claimed is:
1. A light receiving unit comprising:
semiconductor substrates each having a shape that has a pair of long sides parallel to each other and a pair of short sides that are shorter than the long sides and are parallel to each other;
a sensor substrate on which the semiconductor substrates are mounted in a line with gaps provided therebetween, the gaps having a same length;
first pixels disposed on each of the semiconductor substrates, the first pixels being arrayed linearly in parallel with one long side of the long sides; and
second pixels disposed on the semiconductor substrate, the second pixels being separated away from the first pixels in a direction perpendicular to the one long side and arrayed linearly in parallel with the one long side, wherein
the second pixels include:
overlapping pixels disposed on sub-scanning lines that extend in the direction perpendicular to the one long side and pass through outermost pixels among the first pixels, the outermost pixels being located at outermost ends of a linear array of the first pixels; and interpolation pixels disposed on other sub-scanning lines that pass through missing pixels that are disposed farther away from a center of the linear array of the first pixels than the outermost pixels, the light receiving unit further comprises a reading circuit to read a signal of each of the interpolation pixels and the first pixels by scanning the interpolation pixels and the first pixels in a main scanning direction in order from one end to perform signal processing, the reading circuit includes block circuits different from one another in function, the block circuits are circuits obtained by arraying, in the main scanning direction, channel circuits corresponding to the respective pixels, and at least some of the block circuits are arranged by staggering end portions thereof in the main scanning direction so that the end portions are located near a short side, of the pair of short sides, on an acute angle side of the semiconductor substrate.

2. The light receiving unit according to claim 1, wherein an interpolation pixel distance that is a distance between a line of the first pixels and a line of the second pixels in a direction perpendicular to the one long side is equal to a number obtained by multiplying a pixel pitch of the first pixels by a positive integer.

3. The light receiving unit according to claim 1, wherein the interpolation pixels are disposed on the sub-scanning lines that are perpendicular to the one long side and that pass through the missing pixels occurring in the gaps between adjacent semiconductor substrates among the semiconductor substrates.

4. The light receiving unit according to claim 1, wherein the block circuits that are connected to one another through wiring are arranged such that, in accordance with functions of the respective block circuits, (i) the end portions of some of the block circuits are staggered in the main scanning direction so that the end portions are located near the short side on the acute angle side of the semiconductor substrate or (ii) the end portions of some of the block circuits are aligned.

5. The light receiving unit according to claim 1, wherein the first pixels are arrayed linearly along one long side of the long sides, and the second pixels are arrayed linearly, in parallel with the long sides, from an end near to one short side of the short sides in a direction away from the one short side of the short sides.

6. The light receiving unit according to claim 1, further comprising an output data processor to process image data based on outputs by the first pixels and the second pixels, the output data processor being arranged on the sensor substrate, wherein the output data processor performs time correction processing in which image data of the second pixels are coupled with image data of the first pixels that are scanned at a time shifted from a time of scanning of the second pixels by a scanning period corresponding to an interpolation pixel distance that is a distance between a line of the first pixels and a line of the second pixels in a direction perpendicular to the one long side.

7. A light receiving unit comprising:
semiconductor substrates each having a shape that has a pair of sides parallel to each other;

a sensor substrate on which the semiconductor substrates are mounted in a line with gaps provided therebetween, the gaps having a same length;

first pixels disposed on each of the semiconductor substrates, the first pixels being arrayed linearly in parallel with one side of the pair of sides parallel to each other; and second pixels disposed on the semiconductor substrate, the second pixels being separated away from the first pixels by a predetermined interpolation pixel distance in a direction perpendicular to the one side and arrayed linearly in parallel with the one side, wherein the second pixels include:

overlapping pixels disposed on sub-scanning lines that extend in the direction perpendicular to the one side and pass through outermost pixels among the first pixels, the outermost pixels being located at outermost ends of a linear array of the first pixels; and interpolation pixels disposed on other sub-scanning lines that pass through missing pixels that are disposed farther away from a center of the linear array of the first pixels than the outermost pixels, the pair of sides that are parallel to each other of each of the semiconductor substrates is a long side and a short side and the semiconductor substrates each further have a pair of slanted sides that are symmetric with respect to a straight line that extends in a direction perpendicular to the long side, the straight line being an axis of symmetry of the pair of slanted lines, the first pixels of one of two adjacent semiconductor substrates among the semiconductor substrates are arrayed linearly along the long side and the first pixels of the other one of the two adjacent semiconductor substrates are arrayed linearly along the short side, and the second pixels are arrayed linearly, in parallel with the long side, from both end portions near to the slanted sides of the other one of the two adjacent semiconductor substrates in a direction away from the slanted sides.

8. The light receiving unit according to claim 7, wherein the interpolation pixel distance is equal to a number obtained by multiplying a pixel pitch of the first pixels by a positive integer.

9. The light receiving unit according to claim 8, wherein the interpolation pixels are disposed on the sub-scanning lines that are perpendicular to the one side and that pass through the missing pixels occurring in the gaps between adjacent semiconductor substrates among the semiconductor substrates.

10. The light receiving unit according to claim 9, further comprising a reading circuit to read a signal of each of the interpolation pixels and the first pixels by scanning the interpolation pixels and the first pixels in a main scanning direction in order from one end to perform signal processing, wherein the reading circuit includes block circuits different from one another in function, the block circuits are circuits obtained by arraying, in the main scanning direction, channel circuits corresponding to the respective pixels, and at least some of the block circuits are arranged by staggering end portions thereof in the main scanning direction so that the end portions are located near an edge side of the semiconductor substrate.

11. The light receiving unit according to claim 8, further comprising a reading circuit to read a signal of each of the interpolation pixels and the first pixels by scanning the interpolation pixels and the first pixels in a main scanning direction in order from one end to perform signal processing, wherein
the reading circuit includes block circuits different from one another in function,
the block circuits are circuits obtained by arraying, in the main scanning direction, channel circuits corresponding to the respective pixels, and
at least some of the block circuits are arranged by staggering end portions thereof in the main scanning direction so that the end portions are located near an edge side of the semiconductor substrate.

12. The light receiving unit according to claim 7, further comprising a reading circuit to read a signal of each of the interpolation pixels and the first pixels by scanning the interpolation pixels and the first pixels in a main scanning direction in order from one end to perform signal processing, wherein
the reading circuit includes block circuits different from one another in function,
the block circuits are circuits obtained by arraying, in the main scanning direction, channel circuits corresponding to the respective pixels, and
at least some of the block circuits are arranged by staggering end portions thereof in the main scanning direction so that the end portions are located near an edge side of the semiconductor substrate.

13. The light receiving unit according to claim 12, wherein
the block circuits that are connected to one another through wiring are arranged such that, in accordance with functions of the respective block circuits, (i) the end portions of the block circuits are staggered in the main scanning direction or (ii) the end portions of the block circuits are aligned.

14. The light receiving unit according to claim 7, further comprising an output data processor to process image data based on outputs by the first pixels and the second pixels, the output data processor being arranged on the sensor substrate, wherein
the output data processor performs time correction processing in which image data of the second pixels are coupled with image data of the first pixels that are scanned at a time shifted from a time of scanning of the second pixels by a scanning period corresponding to the interpolation pixel distance.

15. The light receiving unit according to claim 7, wherein the interpolation pixels are disposed on the sub-scanning lines that are perpendicular to the one side and that pass through the missing pixels occurring in the gaps between adjacent semiconductor substrates among the semiconductor substrates.

16. A light receiving unit comprising:
semiconductor substrates each having a shape that has a pair of sides parallel to each other;
a sensor substrate on which the semiconductor substrates are mounted in a line with gaps provided therebetween, the gaps having a same length;
first pixels disposed on each of the semiconductor substrates, the first pixels being arrayed linearly in parallel with one side of the pair of sides parallel to each other; and
second pixels disposed on the semiconductor substrate, the second pixels being separated away from the first pixels by a predetermined interpolation pixel distance in a direction perpendicular to the one side and arrayed linearly in parallel with the one side,
wherein
the second pixels include:
overlapping pixels disposed on sub-scanning lines that extend in the direction perpendicular to the one side and pass through outermost pixels among the first pixels, the outermost pixels being located at outermost ends of a linear array of the first pixels; and
interpolation pixels disposed on other sub-scanning lines that pass through missing pixels that are disposed farther away from a center of the linear array of the first pixels than the outermost pixels,
the pair of sides that are parallel to each other of each of the semiconductor substrates is a long side and a short side and the semiconductor substrates each further have a pair of slanted sides that are symmetric with respect to a straight line that extends in a direction perpendicular to the long side, the straight line being an axis of symmetry of the pair of slanted lines,
the first pixels are arrayed linearly along the short side of each of the semiconductor substrates,
the second pixels are arrayed linearly, in parallel with the long side, from both end portions near to the slanted sides in a direction away from the slanted sides, and
two adjacent semiconductor substrates among the semiconductor substrates are arranged to be vertically inverted with respect to each other in a sub-scanning direction.

17. The light receiving unit according to claim 16, wherein
the interpolation pixels are disposed on the sub-scanning lines that are perpendicular to the one side and that pass through the missing pixels occurring in the gaps between adjacent semiconductor substrates among the semiconductor substrates.

18. The light receiving unit according to claim 16, further comprising a reading circuit to read a signal of each of the interpolation pixels and the first pixels by scanning the interpolation pixels and the first pixels in a main scanning direction in order from one end to perform signal processing, wherein
the reading circuit includes block circuits different from one another in function,
the block circuits are circuits obtained by arraying, in the main scanning direction, channel circuits corresponding to the respective pixels, and
at least some of the block circuits are arranged by staggering end portions thereof in the main scanning direction so that the end portions are located near an edge side of the semiconductor substrate.

* * * * *